United States Patent
Hu et al.

(10) Patent No.: US 10,643,523 B2
(45) Date of Patent: May 5, 2020

(54) DISPLAY MODULE AND ELECTRONIC APPARATUS

(71) Applicant: Wuhan China Star Optoelectronics Semiconductor Display Technology Co., Ltd., Wuhan (CN)

(72) Inventors: Lei Hu, Shenzhen (CN); Szu Yuan Wang, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/109,785

(22) Filed: Aug. 23, 2018

(65) Prior Publication Data

US 2019/0228698 A1 Jul. 25, 2019

Related U.S. Application Data

(63) Continuation of application No. PCT/CN2018/079537, filed on Mar. 20, 2018.

(30) Foreign Application Priority Data

Jan. 24, 2018 (CN) .......................... 2018 1 0071926

(51) Int. Cl.
*G09G 3/20* (2006.01)
*H01L 27/32* (2006.01)
*H01L 51/00* (2006.01)

(52) U.S. Cl.
CPC ....... *G09G 3/2092* (2013.01); *H01L 27/3244* (2013.01); *H01L 51/0097* (2013.01);
(Continued)

(58) Field of Classification Search
CPC .......... G09G 3/2092; G09G 2310/0267; H01L 27/3244; H01L 51/0097
See application file for complete search history.

(56) References Cited

U.S. PATENT DOCUMENTS 9,276,055 B1 * 3/2016 Son ...................... H01L 27/1225
2008/0278467 A1 * 11/2008 Hwang ................ G09G 3/3648
345/205

(Continued)

FOREIGN PATENT DOCUMENTS

| CN | 106205394 A | 12/2016 |
| CN | 106847864 A | 6/2017 |
| CN | 107491221 A | 12/2017 |

*Primary Examiner* — Robert J Michaud (57) ABSTRACT

The present disclosure may provide a display module and electronic apparatus. The display module may include: a display panel including a first long side; a first driving circuit board arranged on a back surface of the display panel. The first driving circuit board may be connected to the first long side of the display panel by a first bending portion. The electronic apparatus may include the above-mentioned display module. In the present disclosure, a driver circuit board may be arranged on the first long side. A width of a lower frame of the display module may be shortened, and a screen ratio of the electronic apparatus may be improved without significantly increasing a number of manufacturing processes.

17 Claims, 5 Drawing Sheets

(52) U.S. Cl.
CPC . *G09G 2310/0267* (2013.01); *G09G 2380/02* (2013.01); *H01L 2251/5338* (2013.01)

(56) References Cited

U.S. PATENT DOCUMENTS

| | | | |
|---|---|---|---|
| 2016/0313838 A1* | 10/2016 | Lee | G06F 3/0412 |
| 2018/0210490 A1 | 7/2018 | Jin et al. | |
| 2018/0211587 A1* | 7/2018 | Yu | G06F 1/1652 |
| 2018/0212015 A1 | 7/2018 | Chen | |

* cited by examiner

DISPLAY MODULE AND ELECTRONIC APPARATUS

CROSS-REFERENCE TO RELATED APPLICATIONS

The present application is a continuation-application of International (PCT) Patent Application No. PCT/CN2018/079537, filed on Mar. 20, 2018, which claims foreign priority of Chinese Patent Application No. 201810071926.8, filed on Jan. 24, 2018 in the State Intellectual Property Office of China, the entire contents of which are hereby incorporated by reference.

FIELD

The described embodiments relate to a technology of a display, and more particularly, to a display module and electronic apparatus.

BACKGROUND

In recent years, with the development of technology and the improvement of people's living standards, traditional phones are replaced rapidly by smart phones to become the mainstream in the mobile phone market. The performance of smart phones has also increased at a faster rate. For smart phones, the increase in display performance has always been the goal of the development of mobile phones. From the pixels per inch (PPI) to the subsequent narrow frame, from the 2.5 D glass to the subsequent curved surface design, the display of smart phones is gradually developed to a high screen ratio. Due to the development of flexible active matrix organic light-emitting diode displays, the screen ratio of smart phone has reached over 80%. How to further increase the screen ratio has become problems to be solved in the current display field, especially in the flexible display field.

Due to the current mature technology of gate driver on array (GOA) circuit design, the left and the right frames of the display module can be relatively narrow, so that the higher screen ratio may be obtained. In current, the mobile phone usually adopts a design of curved surfaces in two long side frames and flat surfaces in an upper and a lower short side frames. Compared with the design of the curved surface, in the flat surface design, the same size of the flat surface has a greater visual experience, and thus it becomes very difficult to further increase the screen ratio. The designs of current high screen ratio and high PPI have highly required for a capability of driving integrated circuit data signals, otherwise, the display effect will be abnormal due to signal attenuation on the data signal line.

SUMMARY

The present disclosure may provide a display module and electronic apparatus. A width of a lower frame of the display module may be shortened, and a screen ratio of the electronic apparatus may be improved without significantly increasing a number of manufacturing processes.

In order to solve the above-mentioned technical problem, a technical solution adopted by the present disclosure is to provide a display module including: a display panel, including a main portion and a first curved portion connected to the main portion, wherein the first curved portion includes a first long side opposite to the main portion; and a first driving circuit board arranged on a back surface of the display panel and connected to the first long side of the display panel by a first bending portion; wherein the first driving circuit board includes: a first flexible substrate; a first driving circuit arranged on the first flexible substrate and connected to the display panel; and a first flexible circuit board arranged on the first flexible substrate, wherein the first flexible circuit board is connected to an external signal source and the first driving circuit.

In order to solve the above-mentioned technical problem, another technical solution adopted by the present disclosure is to provide a display module including: a display panel including a first long side; and a first driving circuit board arranged on a back surface of the display panel, wherein the first driving circuit board is connected to the first long side of the display panel by a first bending portion.

In order to solve the above-mentioned technical problem, another technical solution adopted by the present disclosure is to provide an electronic apparatus including a display module, wherein the display module includes: a display panel including a first long side; and a first driving circuit board arranged on a back surface of the display panel, wherein the first driving circuit board is connected to the first long side of the display panel by a first bending portion.

Advantages of the disclosure may follow. As compared with the related art, the present disclosure may provide a display module and electronic apparatus. The electronic apparatus may include a display module, wherein the display module may include: a display module including: a display panel including a first long side; and a first driving circuit board arranged on a back surface of the display panel, wherein the first driving circuit board is connected to the first long side of the display panel by a first bending portion. Due to the mature GOA technology, the existing display module may make frames in left and right long sides to be very narrow. By the present embodiment, a driver circuit board may be arranged on the first long side, to shorten the width of the lower frame of the display module. The screen ratio of the electronic apparatus may be improved without significantly increasing a number of manufacturing processes.

BRIEF DESCRIPTION OF THE DRAWINGS

In order to clearly illustrate the technical solutions of the present disclosure, the drawings used in the description of the embodiments will be briefly described. It is understood that the drawings described herein are merely some embodiments of the present disclosure. Those skilled in the art may derive other drawings from these drawings without inventive effort.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

Figure 1:
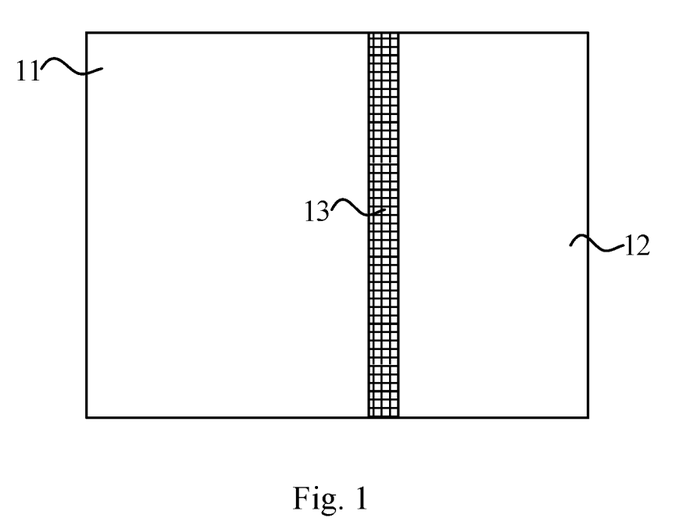
FIG. 1 is an expanded structural illustration in a vertical view of a display module in accordance with an embodiment in the present disclosure.
Figure 5:
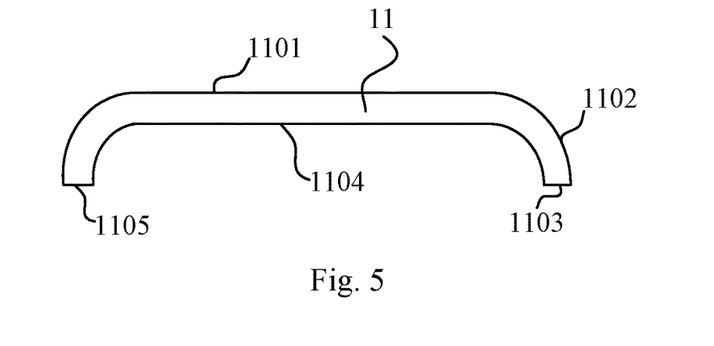
FIG. 5 is a structural illustration in a front view of a display panel of a display module in accordance with an embodiment in the present disclosure.

Referring to FIG. 1 and FIG. 5, FIG. 1 is an expanded structural illustration in a vertical view of a display module in accordance with an embodiment in the present disclosure, and FIG. 5 is a structural illustration in a front view of a display panel of a display module in accordance with an embodiment in the present disclosure. The display module may include: a display panel 11 and a first driving circuit board 12 arranged on a back surface 1104 of the display panel 11.

The display panel 11 may include a main portion 1101 and a first curved portion 1102 connected to the main portion. The first curved portion 1102 may include a first long side 1103 opposite to the main portion 1101. The display panel 11 may further include a display surface configured to display information or images; the back surface 1104 may be a surface opposite to the display surface. The curved portion may be bended form the main portion 1101 and towards the back of the display panel 11.

The first driving circuit board 12 may be connected to a first long side 1103 of the display panel 11 by a first bending portion 13. The first bending portion 13 may correspond to the first curved portion 1102 of the display panel.

Figure 2:
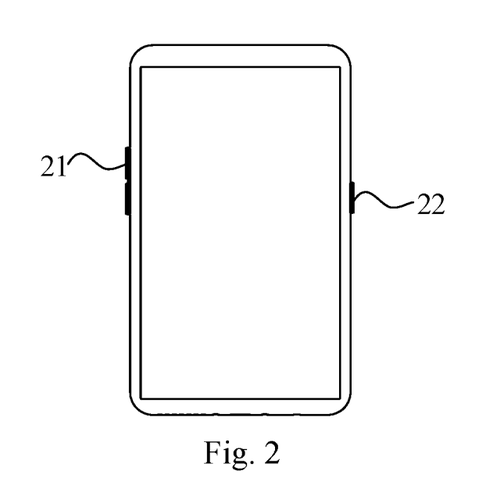
FIG. 2 is a structural illustration of a display module in an electronic apparatus in accordance with an embodiment in the present disclosure.

The first long side 1103 of the display panel 11 may be a long side of an electronic apparatus. For example, if the electronic apparatus is a mobile phone, the first long side 1103 of the display panel 11 may be a left side or a right side of the mobile phone. As shown in FIG. 2, a side where a handset volume control key 21 may be located on the first long side 1103 of the display panel 11, or a side where a power key 22 may be located on the first long side 1103 of the display panel 11.

Figure 3:
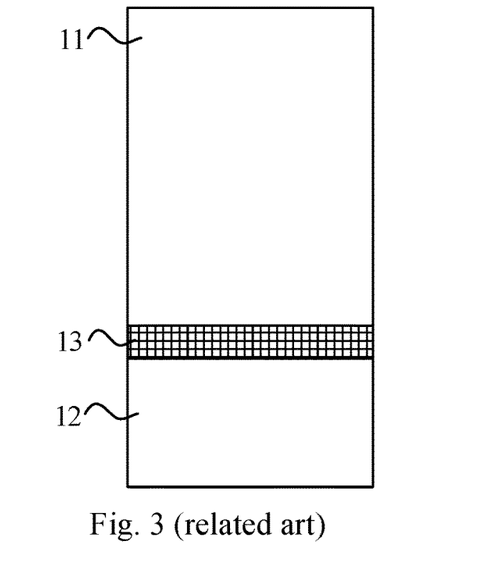
FIG. 3 is an expanded structural illustration in a vertical view of a display module in the related art.

In the related art, it usually uses a design that the first driving circuit board 12 is arranged on a short side of a lower frame of the display panel 11, and a lower frame of the display module is shortened a by bending technology. As shown in FIG. 3, the first driving circuit board 12 is connected to a short side of the display panel 11 by the first bending portion 13.

Figure 4:
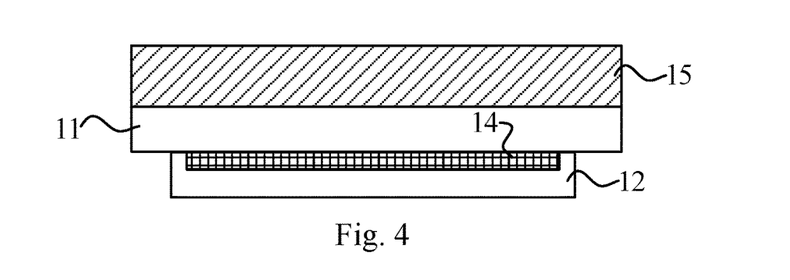
FIG. 4 is a structural illustration in a side view of a display module in accordance with an embodiment in the present disclosure.

As shown in FIG. 4, the first flexible circuit board 12 may be fixed on a back surface 1104 of the display panel 11 by a second reinforcement board 14. The display module may further include a cover plate 15 covering the display panel 11. A shape of the cover plate 15 may be a shape corresponding to the display panel 11. As shown in FIG. 5, the first long side 1103 of the first curved portion 1102 may be a long side of the display panel 11.

As compared with the related art, the present disclosure may provide a display module including: a display panel including a first long side; and a first driving circuit board arranged on a back surface of the display panel, wherein the first driving circuit board is connected to the first long side of the display panel by a first bending portion. Due to the mature GOA technology, the existing display module may make frames in the left and the right long sides to be very narrow. By the present embodiment, a driver circuit board may be arranged on the first long side, to shorten the width of the lower frame of the display module. The screen ratio of the electronic apparatus may be improved without significantly increasing a number of manufacturing processes.

Figure 6:
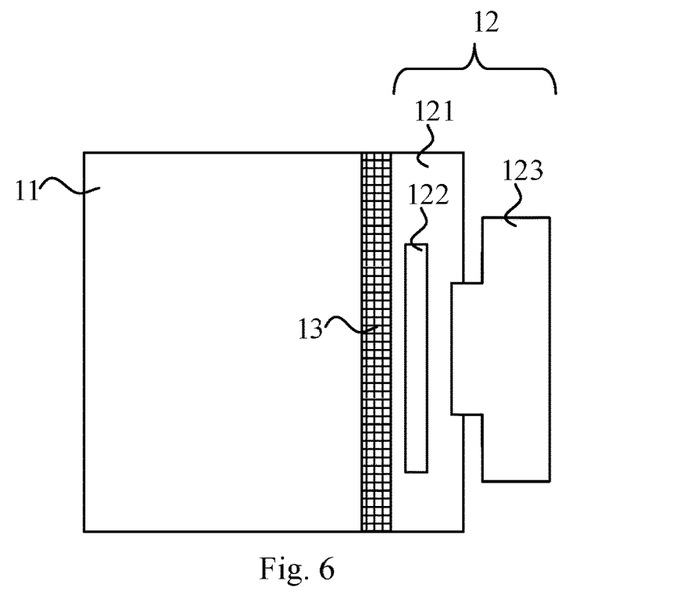
FIG. 6 is an expanded structural illustration in a vertical view of a display module in accordance with another embodiment in the present disclosure.
Figure 7:
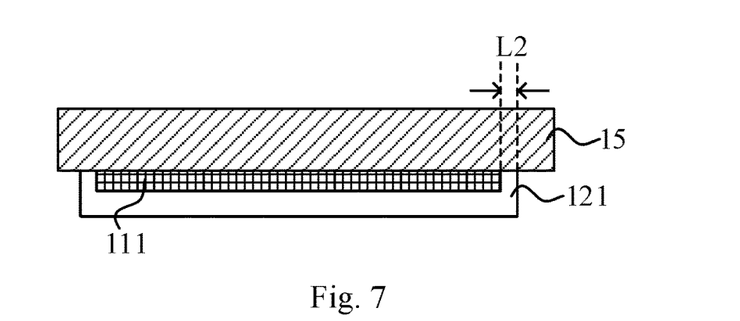
FIG. 7 is a structural illustration in a side view of a display module in accordance with another embodiment in the present disclosure.
Figure 8:
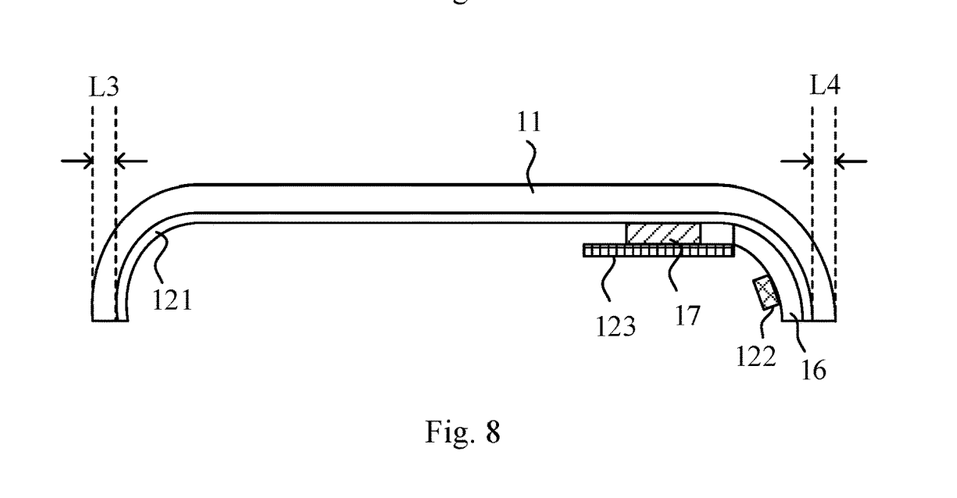
FIG. 8 is a structural illustration in a front view of a display module in accordance with another embodiment in the present disclosure.

Referring to FIGS. 6-8, FIG. 6 is an expanded structural illustration in a vertical view of a display module in accordance with another embodiment in the present disclosure. The display module may include: a display panel 11 including a first long side 1103; a first driving circuit board 12 arranged on a back surface 1104 of the display panel 11; the first driving circuit board 12 may be connected to the first long side 1103 of the display panel 11 by a first bending portion 13. The first driving circuit board may include a first flexible substrate 12; a first driving circuit 122 arranged on the first flexible substrate 12 and connected to the display panel 11; and a first flexible circuit board 123 arranged on the first flexible substrate 121.

The first flexible circuit board 123 may be connected to an external signal source and the first driving circuit 122.

The first driving circuit 122 may be configured to provide image signals required for the display panel 11 to display and GOA signals to drive a circuit of the display panel 11. The first flexible circuit 123 may convert image information to be displayed into an electrical signal that may be recognized by the first driving circuit 122, and may transmit it to the first driving circuit 122 while providing the display panel 11 and providing the first driving circuit 122 with the necessary power.

As shown in FIG. 7, an active area (AA) 111 of the display panel 11 may be located under the cover plate 15, and the first flexible substrate 121 may be connected to the AA 111 and the cover plate 15. Because the first driving circuit 122 and the first flexible circuit board 123 are not placed under the display panel 11, a width of the lower frame may be reduced to L2.

As shown in FIG. 5 and FIG. 8, the first driving circuit board 122 may be fixed on the back surface 1104 of the display panel 11 by a third reinforcement board 16; the first flexible circuit board 123 may be fixed on the back surface 1104 of the display panel 11 by a first reinforcement board 17. L3 is a projection width of a left frame after bending, and L4 is a projection width of a right frame after bending.

Figure 9:
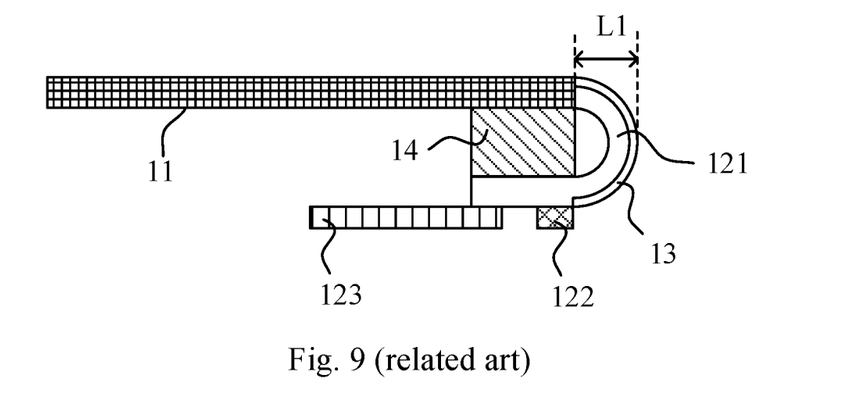
FIG. 9 is a structural illustration in a side view of a display module in the related art.
Figure 10:
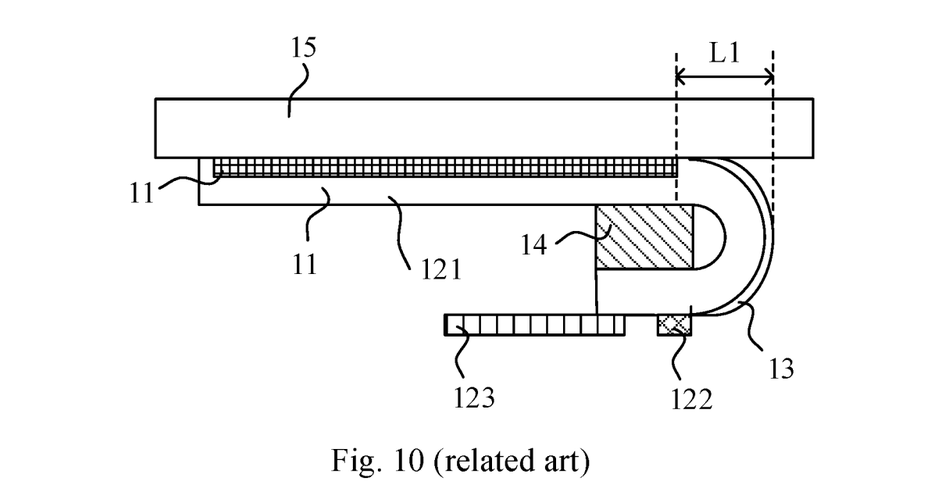
FIG. 10 is a structural illustration in the other side view of a display module in the related art.
Figure 11:
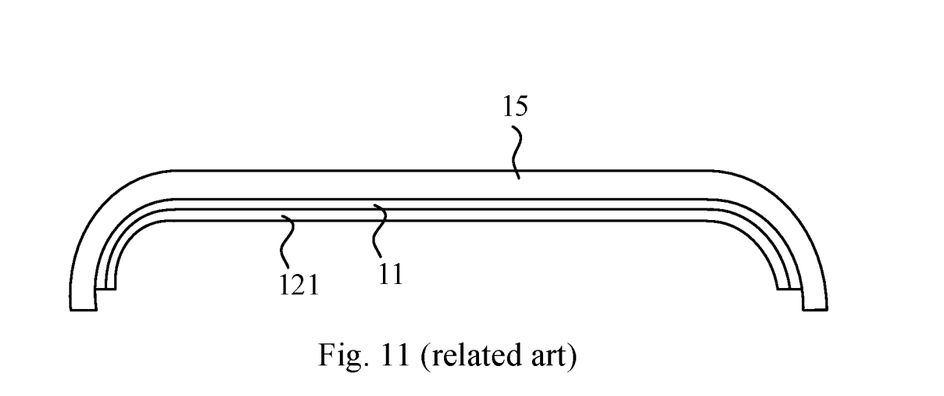
FIG. 11 is a structural illustration in a front view of a display module in the related art.

As shown in FIG. 9, in the related art, the first flexible circuit board 121, the first driving circuit 122, and the first flexible circuit board 123 are bent to the back of the display panel 11 to reduce the width of the lower frame of the display module. The width of the lower frame of the display module is L1, which including widths of a wiring portion and a bending portion of the first flexible substrate 121, as shown in FIG. 10 and FIG. 11.

In the present embodiment, because the first driving circuit board 12 may be connected to the first long side 1103 of the display panel 11, the width of the lower frame of the display module may be less than L1.

In the present embodiment, at least one first driving circuit 122 and one first flexible circuit board 123 may be arranged on the first long side 1103 of the display panel 11. The first driving circuit 122, the first flexible circuit board 123, and the first bending portion 13 that affecting the width of the lower side frame of the display panel, may be arranged on the first long side 1103 of the display panel 11. When the width of the lower frame of the display panel is greatly reduced, the first driving circuit 122 and the first flexible circuit board 123 may be bent to the back of the display panel 11 by the first bending portion 13. By a curved edge effect of a curved cover plate, a width of a plane may be tilted to become a narrow projection width, resulting in a visual experience of a narrow frame without significant increasing in the left and the right frames.

As compared with the related art, in the present embodiment, the first driving circuit board may be connected to the first long side of the display panel by the first bending portion; the first driving circuit board may include the first flexible substrate; the first driving circuit arranged on the first flexible substrate and connected to the display panel; and the first flexible circuit board arranged on the first flexible substrate; the first flexible circuit board may be fixed on the back surface of the display panel by a first reinforcement board, so that the width of the lower frame of the display module may be shortened, and the screen ratio of the electronic apparatus may be improved.

Figure 12:
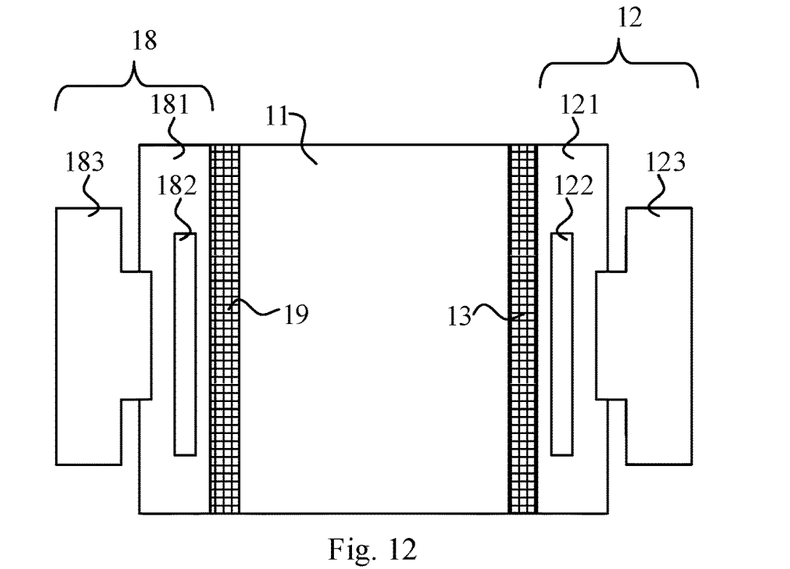
FIG. 12 is an expanded structural illustration in a vertical view of a display module in accordance with further another embodiment in the present disclosure.
Figure 13:
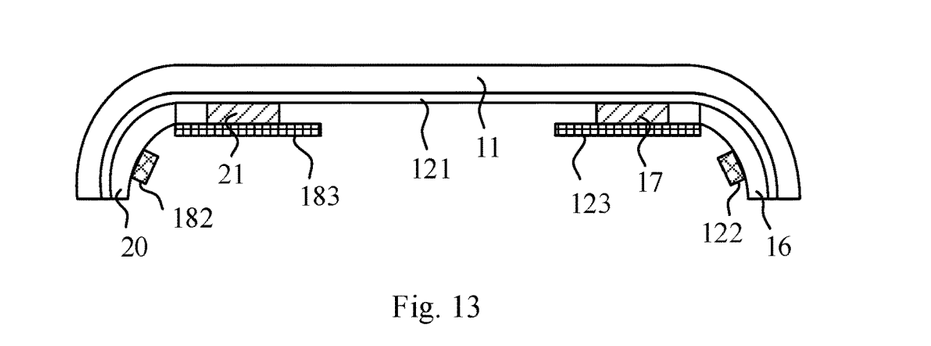
FIG. 13 is a structural illustration in a front view of a display module in accordance with further another embodiment in the present disclosure.

Referring to FIG. 5, FIG. 12, and FIG. 13, FIG. 12 is an expanded structural illustration in a vertical view of a display module in accordance with further another embodiment in the present disclosure. The display module may include: a display panel 11 including a first long side 1103; a first driving circuit board 12 arranged on a back surface 1104 of the display panel 11; the first driving circuit board 12 may be connected to the first long side 1103 of the display panel 11 by a first bending portion 13; The first driving circuit board may include a first flexible substrate 121; a first driving circuit 122 arranged on the first flexible substrate 121 and connected to the display panel 11; and a first flexible circuit board 123 arranged on the first flexible substrate 121.

The display module may further include a second long side 1105 opposite to the first long side 1103; the display module may further include a second driving circuit board 18 connected to the second long side 1105 of the display panel 11 by a second bending portion 19.

The second driving circuit board may include a second flexible substrate 181; a second driving circuit 182 arranged on the second flexible substrate 181 and connected to the display panel 11; and a second flexible circuit board 183 arranged on the second flexible substrate 181. The second flexible circuit board 183 may be connected to an external signal source and the second driving circuit 182.

As shown in FIG. 13, the second driving circuit 182 may be fixed on the back surface 1104 of the display panel 11 by a fourth reinforcement board 20; the second flexible circuit board 183 may be fixed on the back surface 1104 of the display panel 11 by a fifth reinforcement board 13.

The first reinforcement board 17 and the third reinforcement board 16 may support the circuit and the circuit board on the right of the display module, the fourth reinforcement board 20 and the fifth reinforcement board 21 may support the circuit and the circuit board on the left side of the display module. In the right side of the display module, the first driving circuit 122 may be fixed on the back surface 1104 of the display panel 11 by bending the first bending portion 13, and the first reinforcement board 17 may be arranged between the first driving circuit 122 and the back surface 1104 of the display panel 11 as a support; the first flexible circuit board 123 may be fixed on the back surface 1104 of the display panel 11 by bending the first bending portion 13, and the third reinforcement board 16 may be arranged between the first driving circuit 122 and the back surface 1104 of the display panel 11 as a support. In the left side of the display module, the second driving circuit 182 may be fixed on the back surface 1104 of the display panel 11 by bending the second bending portion 19, and the fourth reinforcement board 20 may be arranged between the second driving circuit 182 and the back surface 1104 of the display panel 11 as a support; the second flexible circuit board 183 may be fixed on the back surface 1104 of the display panel 11 by bending the second bending portion 19, and the fifth reinforcement board 21 may be arranged between the second driving circuit 182 and the back surface 1104 of the display panel 11 as a support.

The first driving circuit 122 and the first flexible circuit board 123 may be arranged on the first long side 1103 of the display panel 11, and the first bending portion 13 may be arranged on the first long side 1103; the second driving circuit 182, and the second flexible circuit board 183 may be arranged on the second long side 1105 of the display panel 11, and the second bending portion 19 may be arranged on the second long side 1105. The first driving circuit 122, the first flexible circuit board 123, the second driving circuit 182, and the second flexible circuit board 183 may be not arranged on a lower frame of the display panel 11 and, so that the width of the lower frame of the display panel 11 may be shortened.

The first driving circuit 122 may be connected to pixels of odd-numbered rows of the display panel of the display panel 11, and the second driving circuit 182 may be connected to pixels of even-numbered rows of the display panel 11. The first driving circuit and the second driving circuit may be configured to drive the display panel 11 to perform a progressive scanning, alternately.

In the present embodiment, the first drive circuit 122 may apply data signals of the odd-numbered rows, and the second drive circuit 182 may apply data signals of the even-numbered rows. Compared with a driving circuit applying data signals in a single-side, a data signal output capability of a single drive circuit may not be increased, and a size of the drive circuit may not be increased, so that it may adopt existing conventional drive circuits, but it may increase manufacturing processes of drive circuit. Compared with two driving circuits applying upper half and lower half data signals in a single-side, it may effectively reduce a phenomenon of splitting the screen up and down in the active area due to a difference between the two driving circuits.

In the present embodiment, at least one driving circuit may be bounded on the first long side 1103 of the display panel 11, and at least one flexible circuit may be bounded on the second long side 1105 of the display panel 11. The first driving circuit 122 may be connected to pixels of the odd-numbered rows of the display panel 11, and the second driving circuit 182 may be connected to pixels of the even-numbered rows of the display panel 11, so a display may be drive. The first driving circuit 122, the first flexible circuit board 123, and the first bending portion 13 that affecting the width of the lower side frame of the display panel, may be arranged on the first long side 1103 of the display panel 11, and the second driving circuit 182, the second flexible circuit board 183, and the second bending portion 19 that affecting the width of the lower side frame of the display panel, may be arranged on the second long side 1105 of the display panel 11, such that the width of the lower frame of the display panel may be reduced. Furthermore, the first driving circuit 122 and the first flexible circuit board 123 may be bent to the back of the display panel 11 by the first bending portion 13, and the second driving circuit 182 and the second flexible circuit board 183 may be bent to the back of the display panel 11 by the second bending portion 19. By a curved edge effect of a curved cover plate, a width of a plane may be tilted to become a narrow projection width, resulting in a visual experience of a narrow frame without significant increasing in the left and the right frames, thereby improving the screen ratio of the electronic apparatus.

As compared with the related art, in the present embodiment, the first driving circuit board may be connected to the first long side 1103 of the display panel by the first bending portion, and the second driving circuit board may be connected to the second long side of the display panel by the second bending portion; the first driving circuit board may include the first flexible substrate, and the first driving circuit and the first flexible circuit board arranged on the first flexible substrate; the second driving circuit board may include the second flexible substrate, and the second driving circuit and the second flexible circuit board arranged on the second flexible substrate, such that the width of the lower frame of the display panel may be reduced. The first drive circuit may apply data signals of the odd-numbered rows and the second drive circuit may apply data signals of the even-numbered rows, so as to drive the display panel to perform a progressive scanning, alternately. It may effectively reduce a phenomenon of splitting the screen up and down in the active area due to a difference between the two driving circuits.

Figure 14:
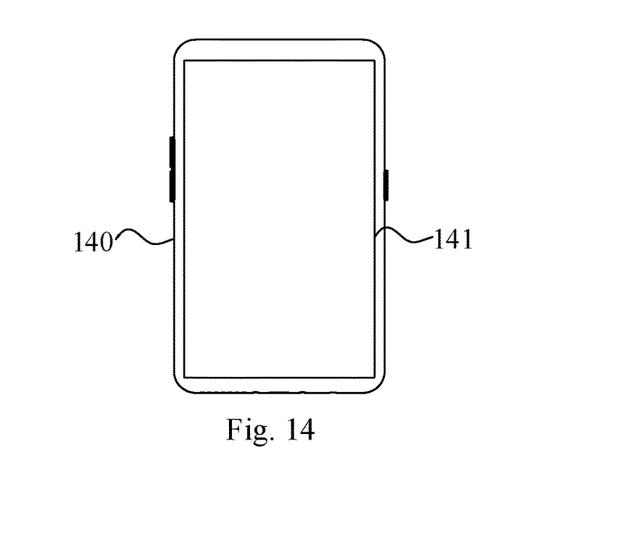
FIG. 14 is a structural illustration of an electronic apparatus in accordance with an embodiment in the present disclosure.

Referring to FIG. 14, FIG. 14 is a structural illustration of an electronic apparatus in accordance with an embodiment in the present disclosure. The electronic apparatus 140 may include the display module 141 in the above-mentioned embodiment.

The electronic apparatus may be a mobile phone, a display, a tablet computer, or the like.

Taking a mobile phone as an example, the mobile phone may be a curved screen mobile phone, and in particular, it may be a curved screen mobile phone that is curved on both sides of the mobile phone, i.e., on long sides. Because the curved screen mobile phone is curved on the both sides, an upper and a lower sides are flat. When frames of a flat area are shortened, the mobile phone may have a higher screen ratio.

The display module in the present embodiment, the drive circuit board may be connected to the first and the second long sides of the display panel, the frames of the upper and the lower sides may be effectively shortened, resulting in a better visual experience.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A display module comprising:
   a display panel, comprising a main portion and a first curved portion connected to the main portion, wherein the first curved portion comprises a first long side opposite to the main portion; and
   a first driving circuit board arranged on a back surface of the display panel and connected to the first long side of the display panel by a first bending portion;
   wherein the first driving circuit board comprises:
   a first flexible substrate;
   a first driving circuit arranged on the first flexible substrate and connected to the display panel; and
   a first flexible circuit board arranged on the first flexible substrate, wherein the first flexible circuit board is connected to an external signal source and the first driving circuit;
   wherein the first flexible circuit board is fixed on the back surface of the display panel;
   wherein a first reinforcement board is arranged between the first flexible circuit board and the back surface of the display panel, and the first reinforcement board is in contact with the first flexible circuit board and is in contact with the back surface of the display panel.

2. The display module according to claim 1, wherein the first driving circuit board is fixed on the back surface of the display panel; and a second reinforcement board is arranged between the first driving circuit and the back surface of the display panel, and the second reinforcement board is in contact with the first driving circuit and is in contact with the back surface of the display panel.

3. The display module according to claim 1, wherein the display panel further comprises a second curved portion connected to the main portion and opposite to the first curved portion, the second curved portion comprises a second long side opposite to the main portion;
   the display module further comprises a second driving circuit board connected to the second long side of the display panel by a second bending portion.

4. The display module according to claim 3, wherein the second driving circuit board comprises:
   a second flexible substrate,
   a second driving circuit arranged on the second flexible substrate and connected to the display panel; and
   a second flexible circuit board arranged on the second flexible substrate, wherein the second flexible circuit board is connected to an external signal source and the second driving circuit.

5. The display module according to claim 4, wherein the first driving circuit is connected to pixels of odd-numbered rows of the display panel, and the second driving circuit is connected to pixels of even-numbered rows of the display panel; the first driving circuit and the second driving circuit are configured to drive the display panel to perform a progressive scanning, alternately.

6. The display module according to claim 1, further comprising a cover plate covering the display panel, wherein a shape of the cover plate is a shape corresponding to the display panel.

7. A display module comprising:
   a display panel comprising a first long side; and a first driving circuit board arranged on a back surface of the display panel, wherein the first driving circuit board is connected to the first long side of the display panel by a first bending portion;

wherein the first driving circuit board comprises:
  a first flexible substrate;
  a first driving circuit arranged on the first flexible substrate and connected to the display panel; and
  a first flexible circuit board arranged on the first flexible substrate, wherein the first flexible circuit board is connected to an external signal source and the first driving circuit;

wherein the first flexible circuit board is fixed on the back surface of the display panel;

wherein a first reinforcement board is arranged between the first flexible circuit board and the back surface of the display panel, and the first reinforcement board is in contact with the first flexible circuit board and is in contact with the back surface of the display panel.

8. The display module according to claim 7, wherein the first driving circuit board is fixed on the back surface of the display panel; and a second reinforcement board is arranged between the first driving circuit and the back surface of the display panel, and the second reinforcement board is in contact with the first driving circuit and is in contact with the back surface of the display panel.

9. The display module according to claim 7, wherein the display panel further comprises a second long side opposite to the first long side;

wherein the display module further comprises a second driving circuit board connected to the second long side of the display panel by a second bending portion.

10. The display module according to claim 9, wherein the second driving circuit board comprises:
  a second flexible substrate;
  a second driving circuit arranged on the second flexible substrate and connected to the display panel; and
  a second flexible circuit board arranged on the second flexible substrate, wherein the second flexible circuit board is connected to an external signal source and the second driving circuit.

11. The display module according to claim 10, wherein the first driving circuit is connected to pixels of odd-numbered rows of the display panel, and the second driving circuit is connected to pixels of even-numbered rows of the display panel; the first driving circuit and the second driving circuit are configured to drive the display panel to perform a progressive scanning, alternately.

12. The display module according to claim 7, wherein the display panel comprises a main portion, a first curved portion connected to the first long side and a second curved portion connected to the second long side.

13. The display module according to claim 7, further comprising a cover plate covering the display panel, wherein a shape of the cover plate is a shape corresponding to the display panel.

14. An electronic apparatus comprising a display module, wherein the display module comprises:
  a display panel comprising a first long side; and
  a first driving circuit board arranged on a back surface of the display panel, wherein the first driving circuit board is connected to the first long side of the display panel by a first bending portion;

wherein the first driving circuit board comprises:
  a first flexible substrate;
  a first driving circuit arranged on the first flexible substrate and connected to the display panel; and
  a first flexible circuit board arranged on the first flexible substrate, wherein the first flexible circuit board is connected to an external signal source and the first driving circuit;

wherein the first flexible circuit board is fixed on the back surface of the display panel;

wherein a first reinforcement board is arranged between the first flexible circuit board and the back surface of the display panel, and the first reinforcement board is in contact with the first flexible circuit board and is in contact with the back surface of the display panel.

15. The electronic apparatus according to claim 14, wherein the first driving circuit board is fixed on the back surface of the display panel; and a second reinforcement board is arranged between the first driving circuit and the back surface of the display panel, and the second reinforcement board is in contact with the first driving circuit and is in contact with the back surface of the display panel.

16. The display module according to claim 1, wherein the first flexible circuit board is parallel to the back surface of the display panel, and an angle is between the first flexible circuit board and the first driving circuit.

17. The display module according to claim 2, wherein the first reinforcement board has a rectangular cross section, and the second reinforcement board has a rectangular cross section with two curved opposite sides.

* * * * *